(12) United States Patent
Kawase (10) Patent No.: US 11,979,970 B2
(45) Date of Patent: May 7, 2024

(54) ELECTRIC COMPONENT, X-RAY GENERATION APPARATUS, AND X-RAY IMAGING APPARATUS

(71) Applicant: Canon Anelva Corporation, Kawasaki (JP)

(72) Inventor: Junya Kawase, Yokohama (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 18/506,276

(22) Filed: Nov. 10, 2023

(65) Prior Publication Data
US 2024/0080962 A1    Mar. 7, 2024

Related U.S. Application Data

(63) Continuation of application No. PCT/JP2022/016708, filed on Mar. 31, 2022.

(51) Int. Cl.
| | |
|---|---|
| *G01N 23/083* | (2018.01) |
| *G01N 23/04* | (2018.01) |
| *H05G 1/30* | (2006.01) |

(52) U.S. Cl.
CPC .............. *H05G 1/30* (2013.01); *G01N 23/04* (2013.01); *G01N 23/083* (2013.01)

(58) Field of Classification Search
CPC .... H05G 1/06; H05G 1/30; H05G 1/32; H01J 35/025; H01J 35/16; H01J 35/165; H01J 35/064; G01N 23/04; G01N 23/083
See application file for complete search history.

(56) References Cited

U.S. PATENT DOCUMENTS

| | | |
|---|---|---|
| 6,570,962 B1 | 5/2003 | Maska et al. |
| 2007/0253164 A1 | 11/2007 | Matsuo et al. |
| 2014/0050305 A1 | 2/2014 | Zhao et al. |
| 2016/0029468 A1 | 1/2016 | Anno et al. |
| 2017/0372865 A1 | 12/2017 | Ishihara et al. |

(Continued)

FOREIGN PATENT DOCUMENTS

| | | |
|---|---|---|
| CN | 105247966 A | 1/2016 |
| JP | H0652821 A | 2/1994 |
| JP | H07312200 A | 11/1995 |

(Continued)

OTHER PUBLICATIONS

International Search Report (PCT/ISA/210) with translation and Written Opinion dated Jun. 21, 2022, by the Japanese Patent Office as the International Searching Authority for International Application No. PCT/JP2022/016708. (13 pages).

(Continued)

*Primary Examiner* — Courtney D Thomas
(74) *Attorney, Agent, or Firm* — BUCHANAN INGERSOLL & ROONEY PC (57) ABSTRACT

An electric component includes an electric circuit and a metal container covering the electric circuit. The metal container includes a side wall portion surrounding the electric circuit, and a closing portion forming an end surface of the metal container while covering an end portion of the side wall portion. An exposed surface of an outer peripheral portion of the closing portion exposed to an outside of the metal container has a roundness in a section perpendicular to the end surface.

16 Claims, 8 Drawing Sheets

(56) References Cited

U.S. PATENT DOCUMENTS

2021/0212188 A1* 7/2021 Kawase ............... G01N 23/083

FOREIGN PATENT DOCUMENTS

| | | |
|---|---|---|
| JP | H10112398 A | 4/1998 |
| JP | 2005516367 A | 6/2005 |
| JP | 2007141595 A | 6/2007 |
| JP | 2019173814 A | 10/2019 |
| WO | 03065402 A1 | 8/2003 |
| WO | 2013102426 A1 | 7/2013 |
| WO | 2016136360 A1 | 9/2016 |

OTHER PUBLICATIONS

Decision to Grant dated Jul. 31, 2023, by the Japan Patent Office for corresponding application JP2023-515851. (5 pages).
Office Action issued on Jan. 3, 2024, by the Taiwanese Patent Office in corresponding Taiwanese Patent Application No. 112111152, and an English Translation of the Office Action. (9 pages).

* cited by examiner

ELECTRIC COMPONENT, X-RAY GENERATION APPARATUS, AND X-RAY IMAGING APPARATUS

CROSS-REFERENCE TO RELATED APPLICATIONS

This application is a Continuation of International Patent Application No. PCT/JP2022/016708, filed Mar. 31, 2022, which is hereby incorporated by reference herein in its entirety.

BACKGROUND OF THE INVENTION

Field of the Invention

The present invention relates to an electric component, an X-ray generation apparatus, and an X-ray imaging apparatus.

Background Art

In an X-ray generation apparatus, an X-ray generation tube and a drive circuit that drives the X-ray generation tube can be stored in an accommodating container that forms the outer surface of the X-ray generation apparatus. The drive circuit generates, for example, a potential difference of about 100 kV, so that the internal space of the accommodating container can be filled with an insulating liquid. The insulating liquid is convected in the internal space of the accommodating container due to heat, and this can cause generation of noise.

SUMMARY OF THE INVENTION

By arranging a metal container, which covers the drive circuit, in the internal space of the accommodating container, noise that can be generated by the convection of the insulating liquid can be blocked. However, if the metal container is arranged in the accommodating container, discharge may occur between the metal container and the accommodating container or the like.

The present invention provides a technique advantageous in reducing discharge between the metal container and the accommodating container or the like.

The first aspect of the present invention relates to an electric component, the electric component comprising an electric circuit and a metal container covering the electric circuit. The metal container includes a side wall portion surrounding the electric circuit, and a closing portion forming an end surface of the metal container while covering an end portion of the side wall portion, and an exposed surface of an outer peripheral portion of the closing portion exposed to an outside of the metal container has a roundness in a section perpendicular to the end surface.

The second aspect of the present invention relates to an X-ray generation apparatus, the X-ray generation apparatus comprising an electric component according to the first aspect, an X-ray generation tube, and an accommodating container that accommodates the electric component and the X-ray generation tube. The electric component is configured to drive the X-ray generation tube, and an internal space of the accommodating container is filled with an insulating liquid.

The third aspect of the present invention relates to an X-ray imaging apparatus, the X-ray imaging apparatus comprising an X-ray generation apparatus according to the second aspect, and an X-ray detector that detects X-rays emitted from the X-ray generation apparatus.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In this specification, terms expressing the direction or position, such as "up" and "down", are terms for expressing the relative position when observing a structure such as a metal container (to be described below) arranged with a given posture. The terms do not exclude arrangement of the structure with another posture.

Figure 1:
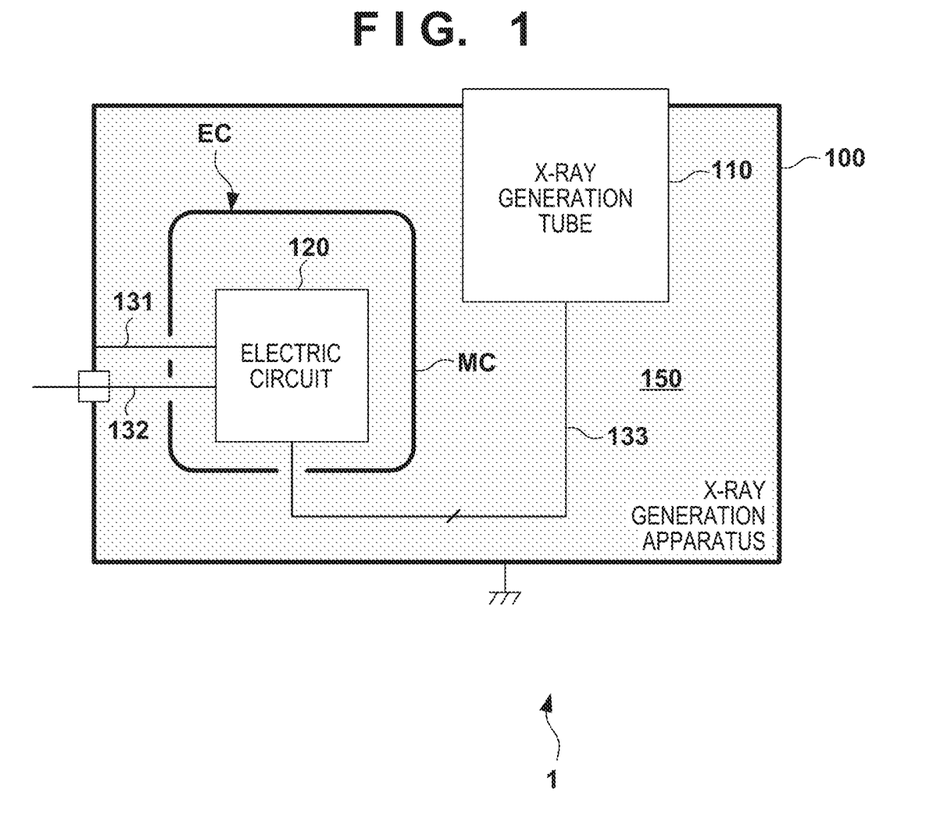
FIG. 1 is a view showing the arrangement of an X-ray generation apparatus according to an embodiment.

FIG. 1 shows the arrangement of an X-ray generation apparatus 1 according to an embodiment. The X-ray generation apparatus 1 can include an X-ray generation tube 110, an electric component EC, an accommodating container (or outer container) 100 accommodating the X-ray generation tube 110 and the electric component EC, and a second electric component (not shown). The X-ray generation tube 110 can be accommodated in the accommodating container 100 such that one surface or a part of the X-ray generation tube 110 is exposed to the external space. The electric component EC can include an electric circuit 120, and a metal container MC covering the electric circuit 120. In an example, the accommodating container 100 can be formed of an electric conductor, and can be grounded. The ground terminal of the electric circuit 120 can be electrically connected to the accommodating container 100 via a cable 131. The positive electrode terminal of the electric circuit 120 can be connected to the positive electrode terminal of an external power supply via a cable 132. The second electric component (not shown) can be accommodated in the accommodating container 100, and arranged outside the metal container MC. The second electric component can be, for example, a Cockcroft circuit or the like.

The electric circuit 120 can be configured to drive the X-ray generation tube 110. The electric circuit 120 can generate one or a plurality of negative drive potentials for driving the X-ray generation tube 110 by receiving a voltage supplied through the cable 132. The one or plurality of negative drive potentials can be supplied to the X-ray generation tube 110 via a cable 133. The X-ray generation tube 110 can be formed as an anode grounding type, and the anode of the X-ray generation tube 110 can be electrically connected to the accommodating container 100. The negative potential generated by the electric circuit 120 can be supplied to the cathode of the X-ray generation tube 110. The electric circuit 120 can generate, for example, a potential difference of 100 kV (for example, −100 kV). The metal container MC can be applied with, for example, a negative potential (for example, −100 kV) of the maximum absolute value generated by the electric circuit 120.

The internal space of the accommodating container 100 can be filled with an insulating liquid 150 such as insulating oil. Due to heat generated by the electric circuit 120, the insulating liquid 150 is convected in the internal space of the accommodating container 100. Such convection can cause generation of noise, but the metal container MC can block transmission of the noise to the electric circuit 120. In order to prevent discharge between the metal container MC and the accommodating container 100 or the second electric component, the metal container MC can have a special structure to be described below. The electric component EC including the metal container MC having such the structure can also be used for applications other than the X-ray generation apparatus.

Figure 2:
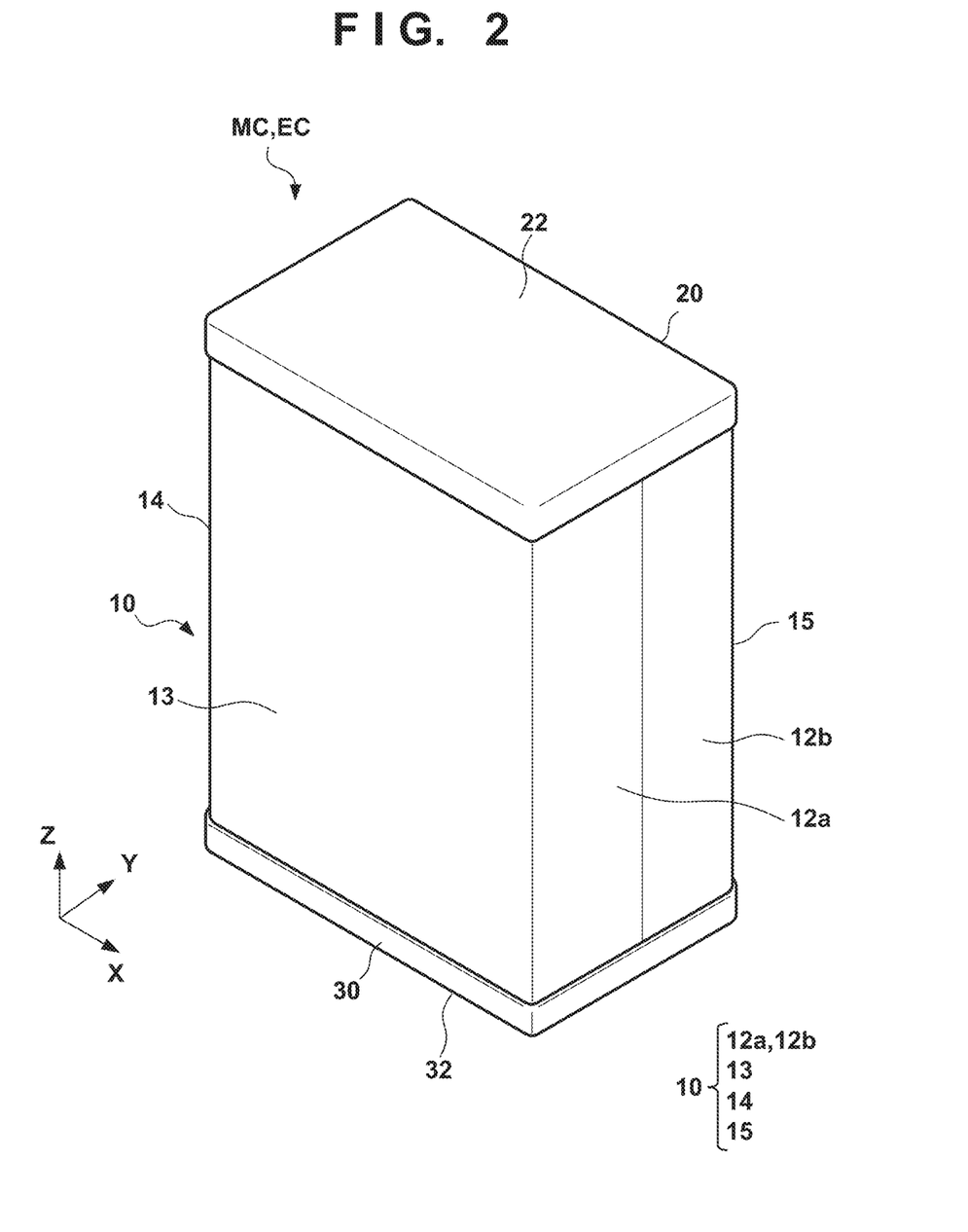
FIG. 2 is a view schematically showing the outer appearance of a metal container or an electric component according to the embodiment.
Figure 3:
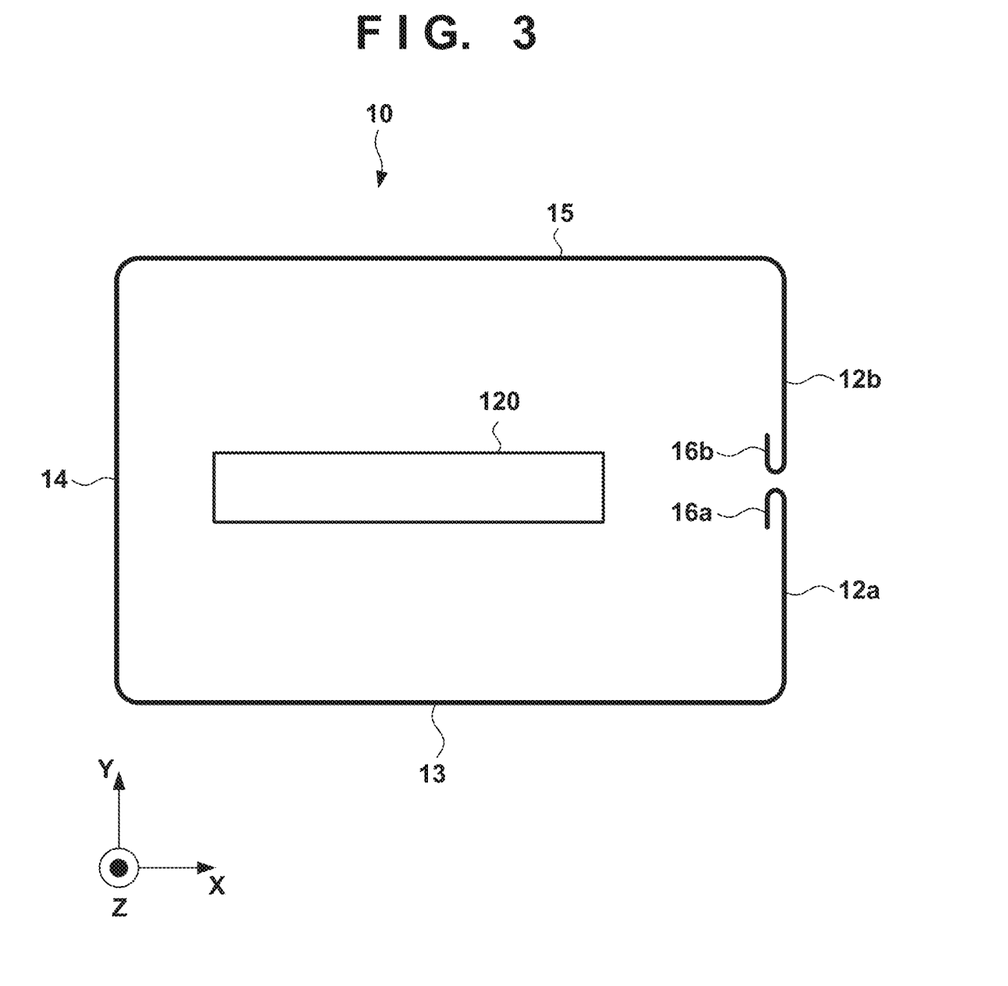
FIG. 3 is a view showing a section obtained by cutting the metal container or the electric component shown in FIG. 2 along a predetermined X-Y plane.
Figure 4:
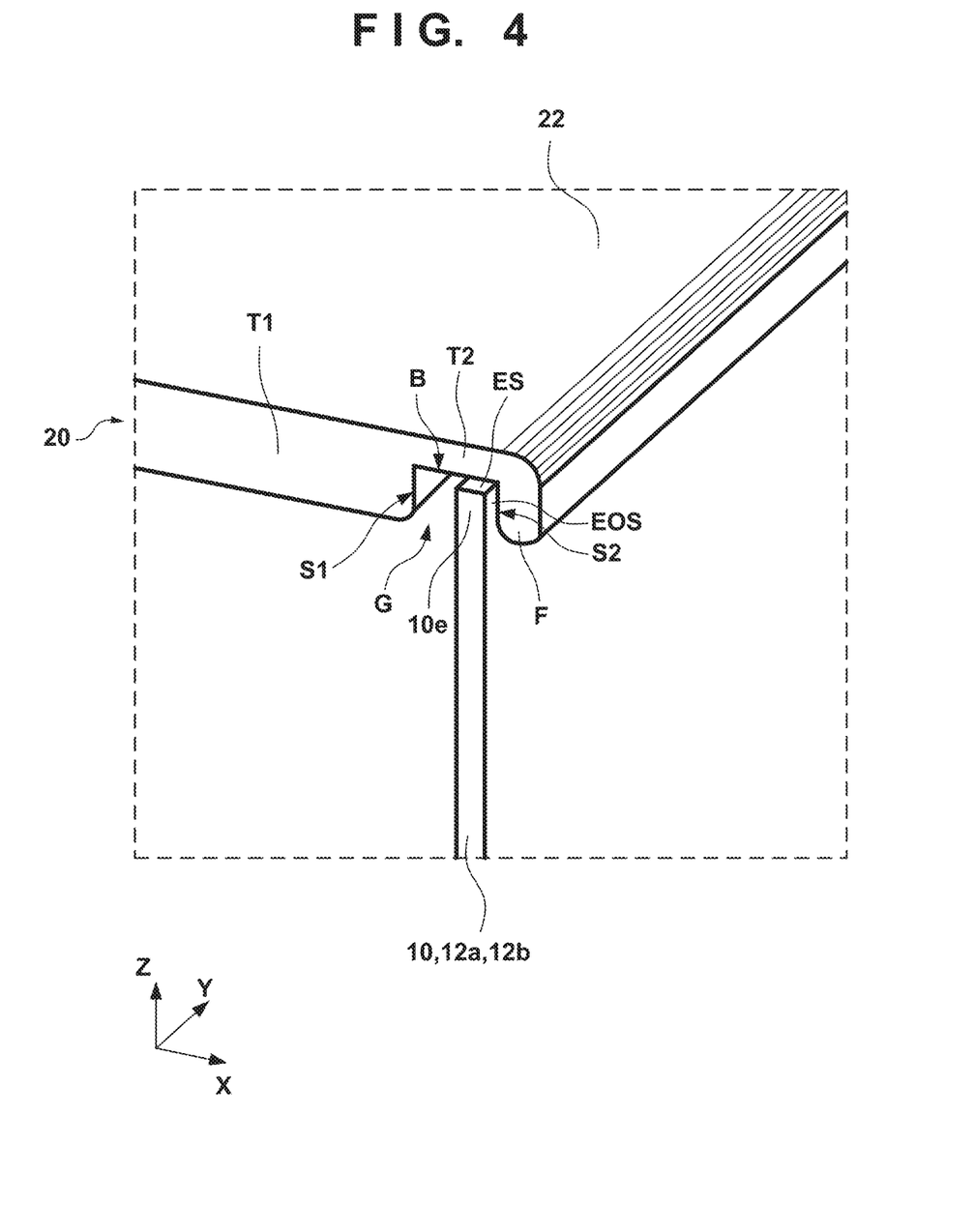
FIG. 4 is a view showing a part of a section obtained by cutting the metal container or the electric component shown in FIG. 2 along a predetermined X-Z plane.
Figure 5:
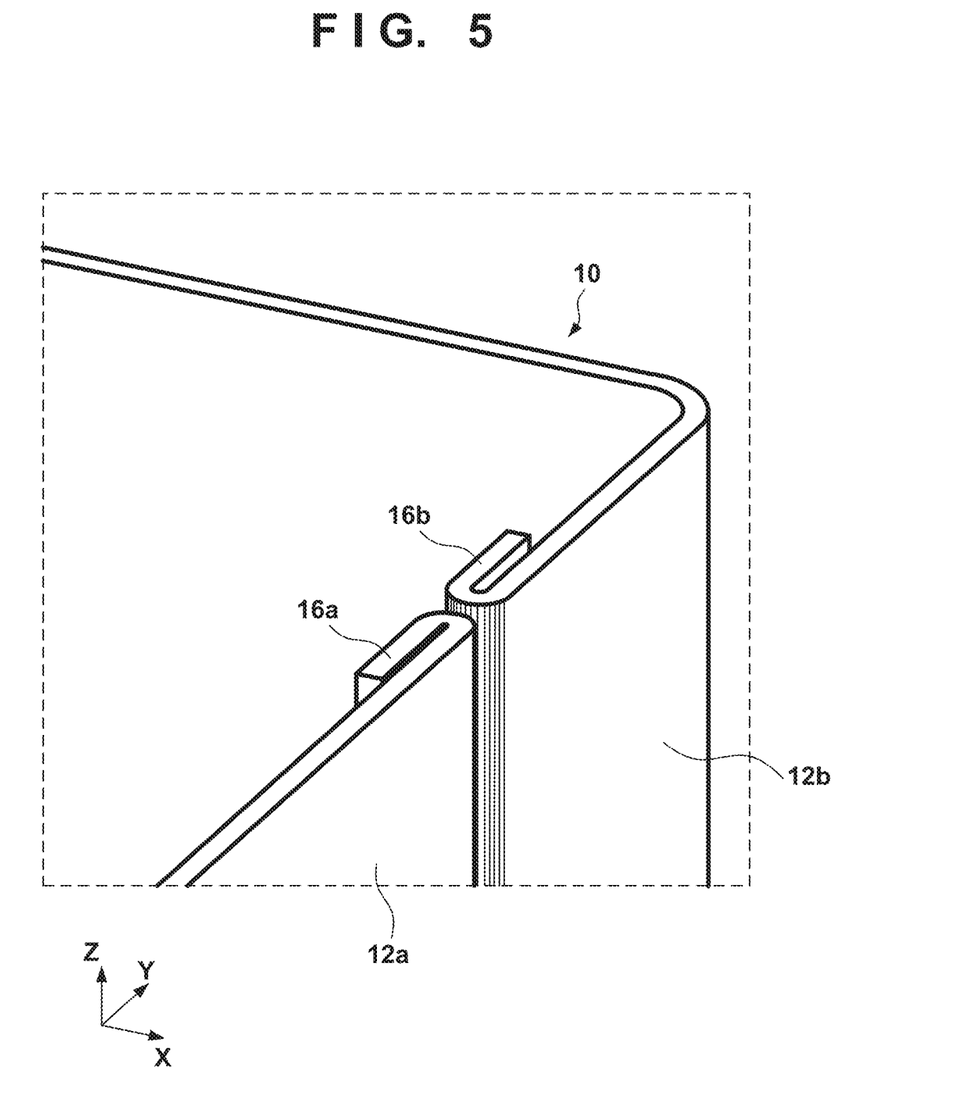
FIG. 5 is a view showing a part of the section obtained by cutting the metal container or the electric component shown in FIG. 2 along the predetermined X-Y plane.

FIG. 2 schematically shows the outer appearance of the metal container MC or the electric component EC according to the embodiment. FIG. 2 shows an XYZ coordinate system, and directions in FIGS. 3 to 5 follow the XYZ coordinate system in FIG. 2. FIG. 3 shows a section obtained by cutting the metal container MC or the electric component EC shown in FIG. 2 along a predetermined X-Y plane. FIG. 4 shows a part of a section obtained by cutting the metal container MC or the electric component EC shown in FIG. 2 along a predetermined X-Z plane. FIG. 5 shows a part of the section obtained by cutting the metal container MC or the electric component EC shown in FIG. 2 along the predetermined X-Y plane.

The metal container MC can include a side wall portion 10 surrounding the electric circuit 120, and closing portions (a top plate 20 and a bottom plate 30) respectively forming end surfaces (a top surface 22 and a bottom surface 32) of the metal container MC while covering end portions 10e of the side wall portion 10. Here, a description will be given assuming that the closing portions (the top plate 20 and the bottom plate 30) respectively forming the end surfaces (the top surface 22 and the bottom surface 32) have similar features. However, one of the closing portions may have the features.

As exemplarily shown in FIG. 4, the exposed surface (in other words, outer surface) of the outer peripheral portion of each of the closing portions (the top plate 20 and the bottom plate 30) exposed to the outside of the metal container MC can have a roundness in a section (for example, X-Z section) perpendicular to the end surfaces (the top surface 22 and the bottom surface 32). This is useful for relaxing concentration of an electric field, and preventing discharge between the metal container MC and the accommodating container 100 or the second electric component.

As exemplarily shown in FIG. 4, the outer peripheral portion of the top plate 20 serving as the first closing portion can include a groove G that accepts the end portion 10e of the side wall portion 10. The end portion 10e of the side wall portion 10 can include an edge surface ES that faces a bottom surface B of the groove G, and an end portion outer surface EOS corresponding to the outer surface of the side wall portion 10 in the vicinity of the edge surface ES. The outer peripheral portion of the top plate 20 serving as the closing portion can include a bent portion F that faces the end portion outer surface EOS of the side wall portion 10. The bent portion F can have an R-processed shape. The top plate 20 serving as the closing portion can include a thick portion T1 and a thin portion T2 surrounding the thick portion T1. The thickness of the thin portion T2 is smaller than the thickness of the thick portion T1. The step difference between the thick portion T1 and the thin portion T2 can form a wall surface S1, which is one of two wall surfaces S1 and S2 defining the groove G, and the bent portion F can form the wall surface S2, which is the other of the two wall surfaces S1 and S2. Such the arrangement is useful for hiding the corner portion such as the end portion 10e of the side wall portion 10 from the external space of the metal container MC, thereby relaxing concentration of the electric field. Such the arrangement is also useful for hiding the corner portion such as the end portion 10e of the side wall portion 10 from the internal space of the metal container MC, thereby relaxing concentration of the electric field.

Although not shown, the bottom plate 30 serving as the second closing portion can also have the features similar to those of the top plate 20 serving as the first closing portion. That is, the bottom plate 30 serving as the second closing portion forms the second end surface 32 of the metal container MC while covering the second end portion (lower end) of the side wall portion 10. The exposed surface of the outer peripheral portion of the bottom plate 30 serving as the second closing portion exposed to the outside of the metal container MC can have a roundness in a section perpendicular to the second end surface 32. The outer peripheral portion of the bottom plate 30 serving as the second closing portion can include the second groove that accepts the second end portion (lower end) of the side wall portion 10. The second end portion (lower end) of the side wall portion 10 can include the second edge surface that faces the bottom surface of the second groove, and the second end portion outer surface corresponding to the outer surface of the side wall portion 10 in the vicinity of the second edge surface 32. The outer peripheral portion of the bottom plate 30 serving as the second closing portion can include the second bent portion that faces the second end portion outer surface of the side wall portion 10. The bottom plate 30 serving as the second closing portion can include the second thick portion and the second thin portion surrounding the second thick portion. The step difference between the second thick portion and the second thin portion can form one of two second wall surfaces defining the second groove, and the second bent portion can form the other of the two second wall surfaces.

Figure 6:
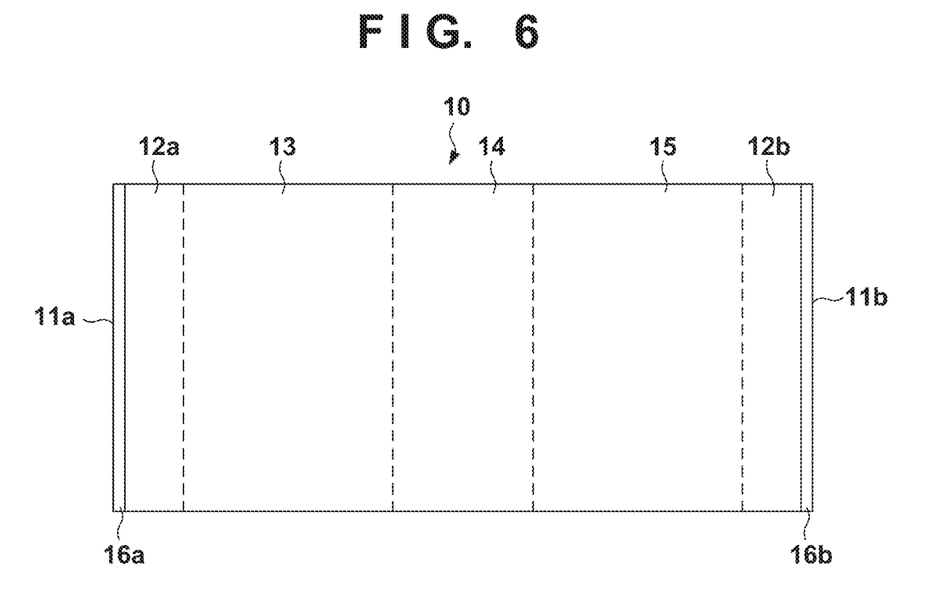
FIG. 6 is a view schematically showing a side wall portion before processing, or the developed state of the side wall portion.

FIG. 6 schematically shows the side wall portion 10 before processing. In another viewpoint, FIG. 6 schematically shows the developed state of the side wall portion 10. The side wall portion 10 can have a structure obtained by bending a plate member having two sets of opposite sides so as to form a rectangular tubular shape in which one set of opposite sides 11a and 11b of the two sets of opposite sides face each other. In addition, as schematically shown in FIGS. 3 and 5, the exposed surface of the outer surface of the side wall portion 10 exposed to the outside of the metal container MC can have roundnesses in a section parallel to the end surfaces (the top surface 22 and the bottom surface 32). The one set of opposite sides 11a and 11b can have hemming-bent shapes 16a and 16b, respectively. Here, as schematically shown in FIGS. 3 and 5, each of the hemming-bent shapes 16a and 16b can be a hemming-bent shape toward the inside of the metal container MC.

The cables 131, 132, and 133 described above can be pulled out from the internal space of the metal container MC to the external section (the internal space of the accommodating container 100) through the space where the opposite sides 11a and 11b face each other. Of course, at least one hole may be provided in at least one of the side wall portion 10, the top plate 20, and the bottom plate 30, and the cables 131, 132, and 133 may be pulled out from the internal space of the metal container MC to the external section (the internal space of the accommodating container 100) through the hole. Such the hole can have a shape having a roundness in a section parallel to the axis of the hole.

Figure 7:
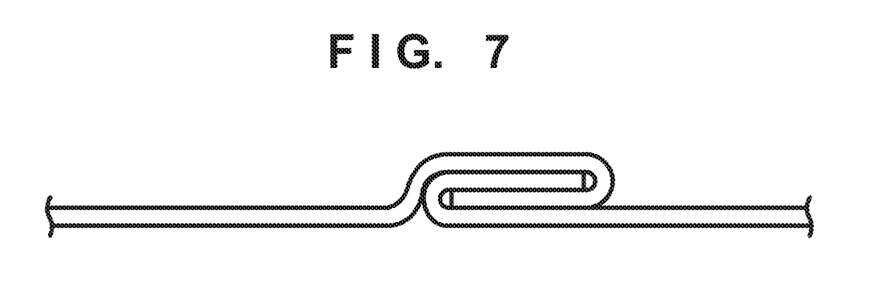
FIG. 7 is a view exemplarily showing the shape or processing method of a side wall member or a plate member.
Figure 8:
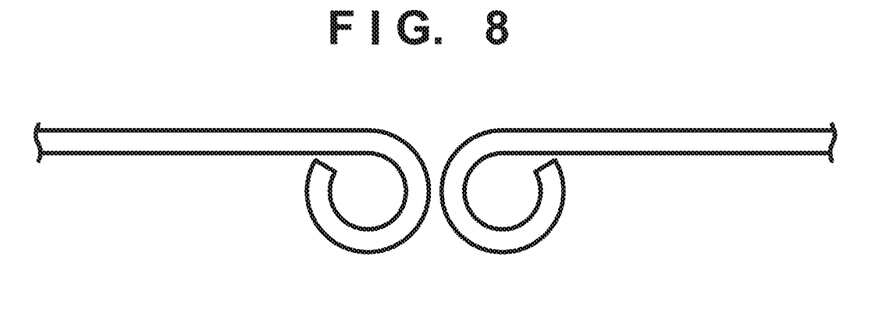
FIG. 8 is a view exemplarily showing the shape or processing method of the side wall member or the plate member.

The hemming-bent shape is merely an example of the shape having a roundness. The shape having a roundness can be selected from various shapes such as a shape formed by curling processing exemplarily shown in FIG. 8. When bending the end portion of the plate member toward the inside of the metal container MC, the bending angle is preferably equal to or larger than 90°. In the case of hemming bending, the bending angle is 180°. When forming the side wall portion 10 by processing the plate member, the plate member may be processed such that the opposite sides (one end and the other end) of the plate member engage each other. For example, as exemplarily shown in FIG. 7, hemming bending can be performed while making the opposite sides (one end and the other end) of the plate member engage each other. In this manner, by processing the shape also having a roundness toward the inside of the metal container MC, it is possible to prevent discharge between the metal container MC and the electric circuit provided inside the metal container MC and having a potential difference with respect to the metal container MC. The processing as described above may be understood as processing for the exposed surface corresponding to the inner surface of the side wall portion 10 exposed to the inside of the metal container MC to have a roundness in the section parallel to the end surfaces (the top surface 22 and the bottom surface 32).

In the example shown in FIGS. 2 to 5, the side wall portion 10 has the rectangular tubular shape formed from first surfaces 12a and 12b, a second surface 13, a third surface 14, and a fourth surface 15, which can be formed from one plate member. However, the side wall portion 10 may be formed from a plurality of members. The side wall portion 10 may have a non-rectangular polygonal tubular shape, a cylindrical shape, or another shape.

Figure 9:
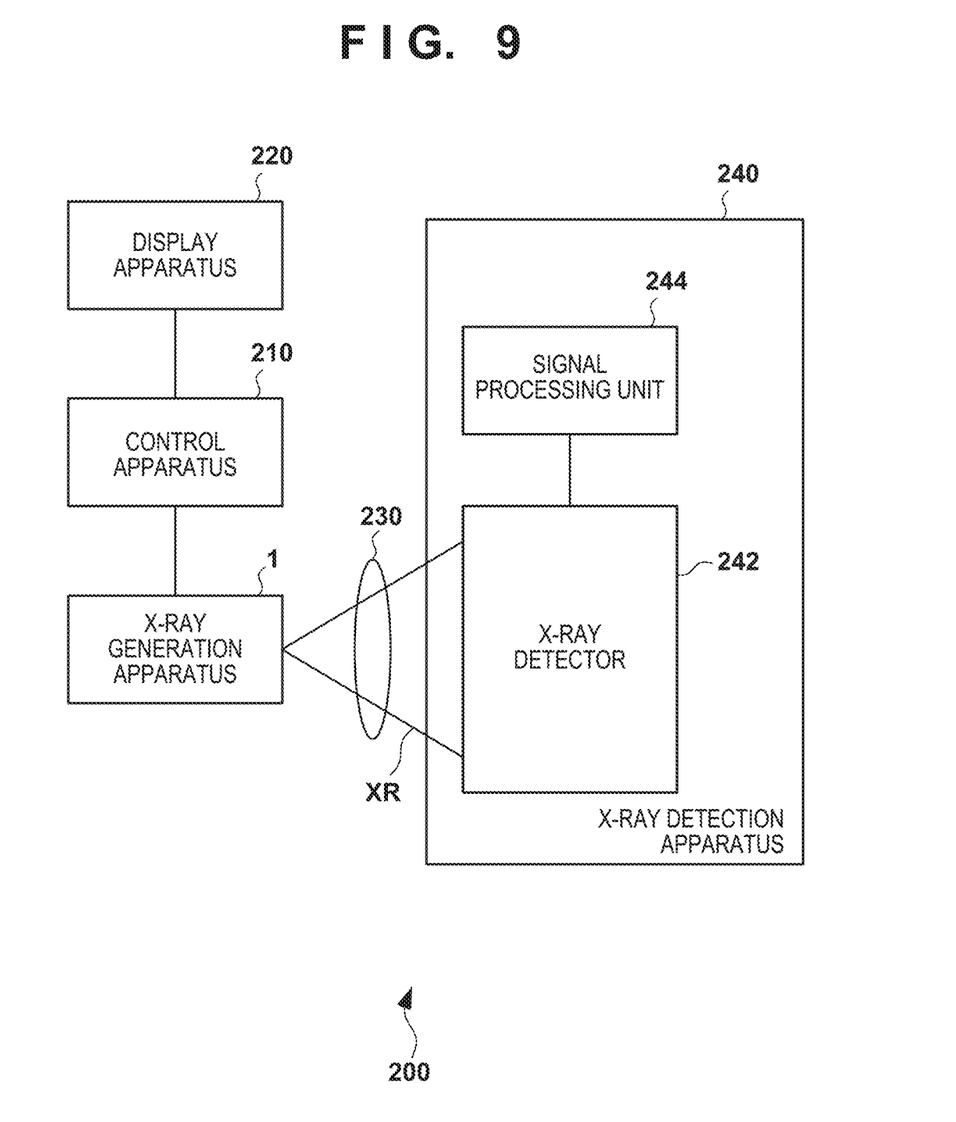
FIG. 9 is a view showing the arrangement of an X-ray imaging apparatus according to the embodiment.

FIG. 9 shows the arrangement of an X-ray imaging apparatus 200 according to the embodiment. The X-ray imaging apparatus 200 can include the X-ray generation apparatus 1, and an X-ray detection apparatus 240 that detects X-rays XR emitted from the X-ray generation apparatus 1 and transmitted through an object 230. The X-ray imaging apparatus 200 may further include a control apparatus 210 and a display apparatus 220. The X-ray detection apparatus 240 can include an X-ray detector 242 and a signal processing unit 244. The control apparatus 210 can control the X-ray generation apparatus 1 and the X-ray detection apparatus 240. The X-ray detector 242 detects or captures the X-rays XR emitted from the X-ray generation apparatus 1 and transmitted through the object 230. The signal processing unit 244 can process a signal output from the X-ray detector 242, and supply the processed signal to the control apparatus 210. Based on the signal supplied from the signal processing unit 244, the control apparatus 210 causes the display apparatus 220 to display an image.

The invention claimed is:

1. An electric component that comprises an electric circuit and a metal container covering the electric circuit, wherein
the metal container includes a side wall portion surrounding the electric circuit, and a closing portion forming an end surface of the metal container while covering an end portion of the side wall portion, and
an exposed surface of an outer peripheral portion of the closing portion exposed to an outside of the metal container has a roundness in a section perpendicular to the end surface, wherein
the outer peripheral portion of the closing portion includes a groove that accepts the end portion of the side wall portion,
the end portion of the side wall portion includes an edge surface that faces a bottom surface of the groove, and an end portion outer surface corresponding to an outer surface of the side wall portion in a vicinity of the edge surface,
the outer peripheral portion of the closing portion includes a bent portion that faces the end portion outer surface of the side wall portion,
the closing portion includes a thick portion and a thin portion surrounding the thick portion, and
a step difference between the thick portion and the thin portion forms one of two wall surfaces defining the groove, and the bent portion forms the other of the two wall surfaces.

2. The electric component according to claim 1, further including
a second closing portion forming a second end surface of the metal container while covering a second end portion of the side wall portion,
wherein an exposed surface of an outer peripheral portion of the second closing portion exposed to the outside of the metal container has a roundness in a section perpendicular to the second end surface.

3. The electric component according to claim 2, wherein the outer peripheral portion of the second closing portion includes a second groove that accepts the second end portion of the side wall portion.

4. The electric component according to claim 3, wherein the second end portion of the side wall portion includes a second edge surface that faces a bottom surface of the second groove, and a second end portion outer surface corresponding to the outer surface of the side wall portion in a vicinity of the second edge surface, and
the outer peripheral portion of the second closing portion includes a second bent portion that faces the second end portion outer surface of the side wall portion.

5. The electric component according to claim 4, wherein the second closing portion includes a second thick portion and a second thin portion surrounding the second thick portion, and
a step difference between the second thick portion and the second thin portion forms one of two second wall surfaces defining the second groove, and the second bent portion forms the other of the two second wall surfaces.

6. The electric component according to claim 1, wherein the side wall portion has a structure obtained by bending a plate member having two sets of opposite sides so as to form a tubular shape in which one set of opposite sides of the two sets of opposite sides face each other, and an exposed surface of an outer surface of the side wall portion exposed to the outside of the metal container has a roundness in a section parallel to the end surface.

7. The electric component according to claim 6, wherein each of the one set of opposite sides of the two sets of opposite sides has a hemming-bent shape.

8. The electric component according to claim 7, wherein the hemming-bent shape is a hemming-bent shape toward an inside of the metal container.

9. An X-ray generation apparatus comprising:
an electric component defined in claim 1;
an X-ray generation tube; and
an accommodating container that accommodates the electric component and the X-ray generation tube,
wherein the electric component is configured to drive the X-ray generation tube, and
an internal space of the accommodating container is filled with an insulating liquid.

10. An X-ray imaging apparatus comprising:
an X-ray generation apparatus defined in claim 9; and
an X-ray detector that detects X-rays emitted from the X-ray generation apparatus.

11. An electric component that comprises an electric circuit and a metal container covering the electric circuit, wherein
the metal container includes a side wall portion surrounding the electric circuit, a first closing portion forming a first end surface of the metal container while covering a first end portion of the side wall portion, and a second closing portion forming a second end surface of the metal container while covering a second end portion of the side wall portion,
an exposed surface of an outer peripheral portion of the first closing portion exposed to an outside of the metal container has a roundness in a section perpendicular to the end surface,
an exposed surface of an outer peripheral portion of the second closing portion exposed to the outside of the metal container has a roundness in a section perpendicular to the second end surface,
the outer peripheral portion of the second closing portion includes a second groove that accepts the second end portion of the side wall portion,
the second end portion of the side wall portion includes a second edge surface that faces a bottom surface of the second groove, and a second end portion outer surface corresponding to the outer surface of the side wall portion in a vicinity of the second edge surface,
the outer peripheral portion of the second closing portion includes a second bent portion that faces the second end portion outer surface of the side wall portion,
the second closing portion includes a second thick portion and a second thin portion surrounding the second thick portion, and
a step difference between the second thick portion and the second thin portion forms one of two second wall surfaces defining the second groove, and the second bent portion forms the other of the two second wall surfaces.

12. The electric component according to claim 11, wherein the side wall portion has a structure obtained by bending a plate member having two sets of opposite sides so as to form a tubular shape in which one set of opposite sides of the two sets of opposite sides face each other, and an exposed surface of an outer surface of the side wall portion exposed to the outside of the metal container has a roundness in a section parallel to the end surface.

13. The electric component according to claim 12, wherein each of the one set of opposite sides of the two sets of opposite sides has a hemming-bent shape.

14. The electric component according to claim 13, wherein the hemming-bent shape is a hemming-bent shape toward an inside of the metal container.

15. An X-ray generation apparatus comprising:
an electric component defined in claim 11;
an X-ray generation tube; and
an accommodating container that accommodates the electric component and the X-ray generation tube,
wherein the electric component is configured to drive the X-ray generation tube, and
an internal space of the accommodating container is filled with an insulating liquid.

16. An X-ray imaging apparatus comprising:
an X-ray generation apparatus defined in claim 15; and
an X-ray detector that detects X-rays emitted from the X-ray generation apparatus.

* * * * *